United States Patent
Liu (10) Patent No.: US 12,328,113 B2
(45) Date of Patent: Jun. 10, 2025

(54) PD CONTROLLER IC AND CONTROL METHOD FOR POWER SWITCH

(71) Applicant: VIA LABS, INC., New Taipei (TW)

(72) Inventor: Jung-Chang Liu, New Taipei (TW)

(73) Assignee: VIA LABS, INC., New Taipei (TW)

( * ) Notice: Subject to any disclaimer, the term of this patent is extended or adjusted under 35 U.S.C. 154(b) by 41 days.

(21) Appl. No.: 18/329,593

(22) Filed: Jun. 6, 2023

(65) Prior Publication Data

US 2024/0305290 A1 Sep. 12, 2024

(30) Foreign Application Priority Data

Mar. 8, 2023 (TW) .................................. 112108592

(51) Int. Cl.
*H03K 17/16* (2006.01)
*H03K 17/56* (2006.01)

(52) U.S. Cl.
CPC ........... *H03K 17/163* (2013.01); *H03K 17/56* (2013.01); *G06F 2213/0042* (2013.01)

(58) Field of Classification Search
CPC .......... G06F 2213/0042; H03K 17/163; H03K 17/56; H03K 17/687
USPC ................. 327/365, 392, 398, 399
See application file for complete search history.

(56) References Cited

U.S. PATENT DOCUMENTS

| | | | |
|---|---|---|---|
| 9,496,726 B2 | 11/2016 | Frid et al. | |
| 9,705,502 B2* | 7/2017 | Wang | H03K 19/017509 |
| 10,756,644 B1* | 8/2020 | Shah | H02M 3/07 |
| 2003/0095368 A1* | 5/2003 | Daniels | H03K 17/0822 |
| | | | 361/93.9 |
| 2013/0093499 A1* | 4/2013 | Chen | H03K 17/102 |
| | | | 327/436 |
| 2019/0278731 A1* | 9/2019 | Mattos | G06F 1/3215 |

FOREIGN PATENT DOCUMENTS

| | | |
|---|---|---|
| TW | 1403873 | 8/2013 |
| TW | 201640803 | 11/2016 |
| TW | 1663823 | 6/2019 |

OTHER PUBLICATIONS

"Office Action of Taiwan Counterpart Application", issued on Sep. 22, 2023, p. 1-p. 9.

* cited by examiner

*Primary Examiner* — William Hernandez
(74) *Attorney, Agent, or Firm* — JCIPRNET (57) ABSTRACT

A power delivery (PD) controller integrated circuit (IC) and a control method for a power switch are provided. A first terminal and a second terminal of the power switch are respectively coupled to a power pin of a universal serial bus (USB) connector and a power input terminal of a functional circuit. The PD controller IC generates a power switch control voltage to control the power switch. The PD controller IC may adjust a level of the power switch control voltage in stages during a power-on period of the functional circuit to gradually turn on the power switch.

19 Claims, 6 Drawing Sheets

PD CONTROLLER IC AND CONTROL METHOD FOR POWER SWITCH

CROSS-REFERENCE TO RELATED APPLICATION

This application claims the priority benefit of Taiwan application serial no. 112108592, filed on Mar. 8, 2023. The entirety of the above-mentioned patent application is hereby incorporated by reference herein and made a part of this specification.

BACKGROUND

Technical Field

The disclosure relates to a consumer electronic product; more particularly, the disclosure relates to a power delivery (PD) controller integrated circuit (IC) and a control method for a power switch.

Description of Related Art

In general, a user may use a charger or an adapter to supply power to a consumer electronic product, such as a desk lamp, a speaker, or any other consumer electronic product. A connection interface between the charger and the consumer electronic product is generally a connector that conforms to the standard specification. For instance, the connection interface between the charger and the consumer electronic product may include a universal serial bus (USB) type-A connector or a USB type-C connector that conforms to the USB specification. A computer or any other host may also supply power to the consumer electronic product through the USB connector.

When a USB host (or a USB charger or a USB adapter) is connected to the USB connector of the consumer electronic product, a power delivery (PD) controller of the consumer electronic product may exchange configuration information with the USB host via a configuration channel (CC) pin of the USB connector, so as to negotiate a power transmission mode between the USB host and the consumer electronic product. Operations in association with the PD controller and the CC pin are regulated in the USB specification and thus will not be further described here. After the power transmission mode is determined, the PD controller may turn on a power switch connected between a power pin (a Vbus pin) of the USB connector and a power input terminal of a functional circuit. After the power switch is turned on, the USB host may supply power to the functional circuit of the consumer electronic product through the USB connector and the power switch. The USB specification regulates a slew rate (SR) of a power voltage that supplies power to the functional circuit when the power switch is turned on. How to control the power switch to comply with the regulations of the SR in the USB specification when the power switch is turned on is one of many technical issues in the pertinent field.

In addition, the power transmission mode required by the consumer electronic product may be a high voltage mode. For instance, the consumer electronic product may require the USB host to provide 12 volts (V) of voltage, 20V, or even a higher voltage. Generally, in order to effectively drive the power switch connected to the Vbus pin of the USB connector, the PD controller is required to provide a power switch control voltage greater than a voltage of the Vbus pin to a control terminal of the power switch. The conventional PD controller produced by performing the general manufacturing process is unable to provide/control a high-level power switch control voltage because a voltage withstanding range of a switch element in the general manufacturing process is less than a swing range of the power switch control voltage. Therefore, the conventional PD controller is implemented by performing a high-voltage manufacturing process. However, manufacturing costs of the high-voltage manufacturing process are considerable. How to enable the PD controller produced by performing the general manufacturing process to provide/control the high-level power switch control voltage is one of many technical issues in the pertinent field.

It should be noted that the content of the "Description of Related Art" section is used to help understand the disclosure. Some of the content (or all of the content) disclosed in the "Description of Related Art" section may not be known by those of ordinary skill in the art. The content disclosed in the "Description of Related Art" section does not mean that the content has been known to those with ordinary knowledge in the technical field before the application is filed.

SUMMARY

The disclosure provides a PD controller IC and a control method for a power switch to gradually turn on the power switch.

In an embodiment of the disclosure, the PD controller IC is configured to generate a power switch control voltage to control the power switch. A first terminal and a second terminal of the power switch are respectively coupled to a power pin of a universal serial bus (USB) connector and a power input terminal of a functional circuit. The PD controller IC may adjust a level of the power switch control voltage in stages during a power-on period of the functional circuit to gradually turn on the power switch.

In an embodiment of the disclosure, the control method for the power switch includes following steps. A power switch control voltage is generated by a PD controller IC to control the power switch, where a first terminal and a second terminal of the power switch are respectively coupled to a power pin of a USB connector and a power input terminal of a functional circuit. In a power-on period of the functional circuit, a level of the power switch control voltage is adjusted in stages to gradually turn on the power switch.

In view of the above, the PD controller IC provided in one or more embodiments of the disclosure is able to adjust the level of the power switch control voltage in stages during the power-on period of the functional circuit to gradually turn on the power switch. Hence, a slew rate (SR) of a power voltage passing through the power switch may comply with the USB specification. In some embodiments, a charge pump voltage generated by the PD controller IC may be transmitted to a control terminal of the power switch through a plurality of switches of the PD controller IC and may act as the power switch control voltage. The switches are turned on or turned off, based on which the power switch control voltage may serve to control the power switch coupled between the USB connector and the functional circuit. When a (j−1)th switch of the switches is turned off, a voltage control circuit of the PD controller IC may ensure a voltage difference between a voltage of a first terminal of the (j−1)th switch and a voltage of a second terminal of the (j−1)th switch to be less than a maximum withstanding voltage of the (j−1)th switch. Accordingly, the PD controller IC configured to provide/control a high control voltage may be implemented by performing a normal low-voltage manufacturing process rather than performing a relatively expensive high-voltage manufacturing process adapted to the control of high voltages.

In order for the features and advantages of the disclosure to be more comprehensible, the following specific embodiments are described in detail in conjunction with the drawings.

BRIEF DESCRIPTION OF THE DRAWINGS

The accompanying drawings, which are included to provide a further understanding of the disclosure, are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The terminology "couple (or connect)" used throughout the whole description of the disclosure (including the claims) may refer to any direct or indirect connection means. For instance, if the disclosure describes that a first device is coupled (or connected) to a second device, it should be interpreted that the first device may be directly connected to the second device, or that the first device may be indirectly connected to the second device through other devices or certain connection means. The terminologies such as "first" and "second" mentioned in the description of the disclosure (including the claims) are only used to name different elements or to distinguish different embodiments or scopes and are not intended to limit the upper or lower limit of the number of the elements, nor are they intended to limit the manufacturing order or disposition order of the elements. Moreover, wherever possible, elements/components/steps with the same reference numbers in the drawings and the embodiments denote the same or similar parts. Cross-reference may be made to related descriptions of elements/components/steps with the same reference numbers or the same terminologies in different embodiments.

Figure 1:
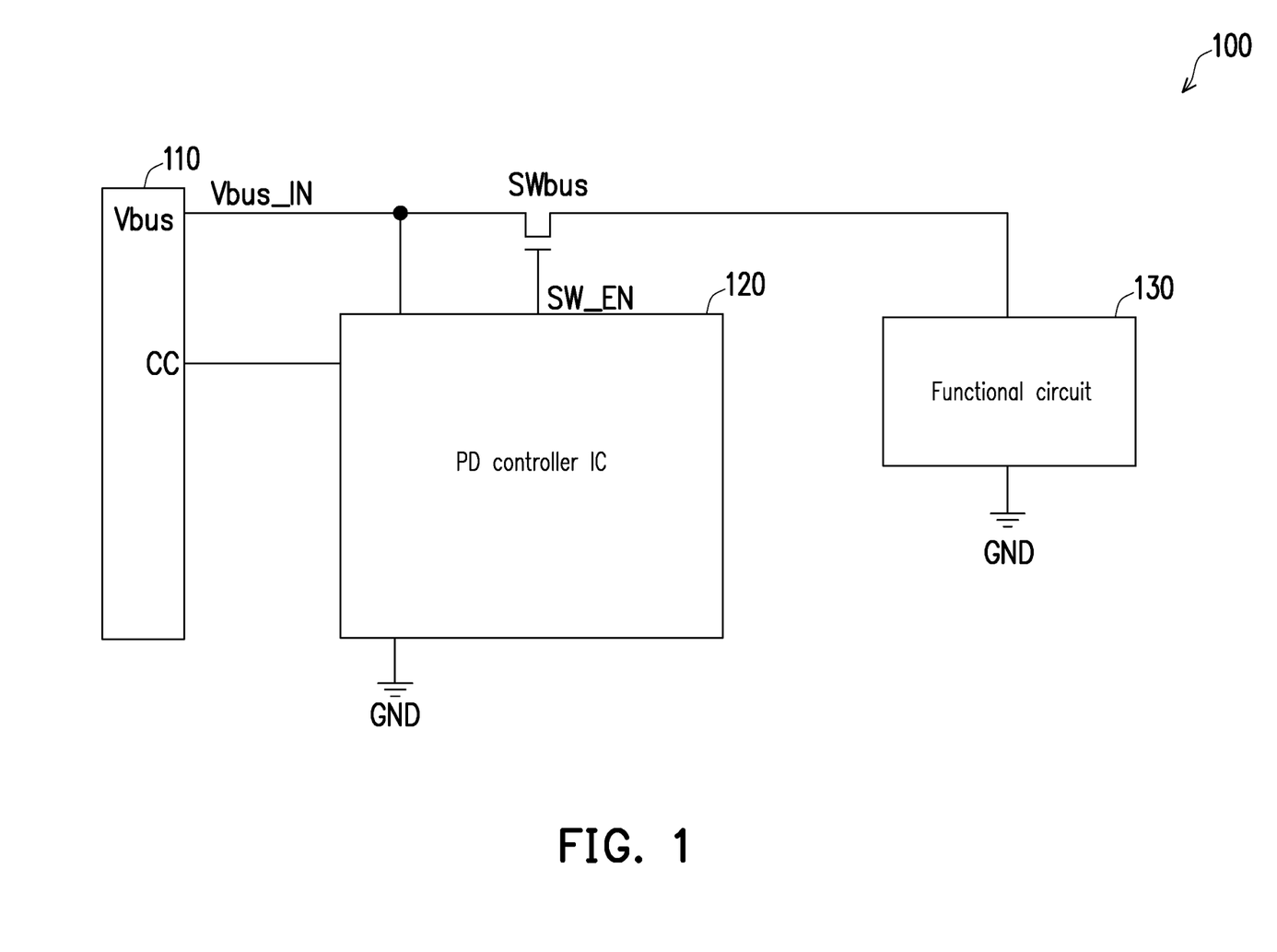
FIG. 1 is a schematic circuit block view illustrating a consumer electronic product according to an embodiment of the disclosure.

FIG. 1 is a schematic circuit block view illustrating a consumer electronic product 100 according to an embodiment of the disclosure. The consumer electronic product 100 shown in FIG. 1 includes a USB connector 110, a power delivery (PD) controller integrated circuit (IC) 120, a functional circuit 130, and a power switch SWbus. As an example, the USB connector 110 may include a USB type-C connector. A first terminal of the power switch SWbus is coupled to a power pin Vbus of the USB connector 110. A second terminal of the power switch SWbus is coupled to a power input terminal of the functional circuit 130. A control terminal of the power switch SWbus is coupled to the PD controller IC 120 to receive a power switch control voltage SW_EN.

Figure 2:
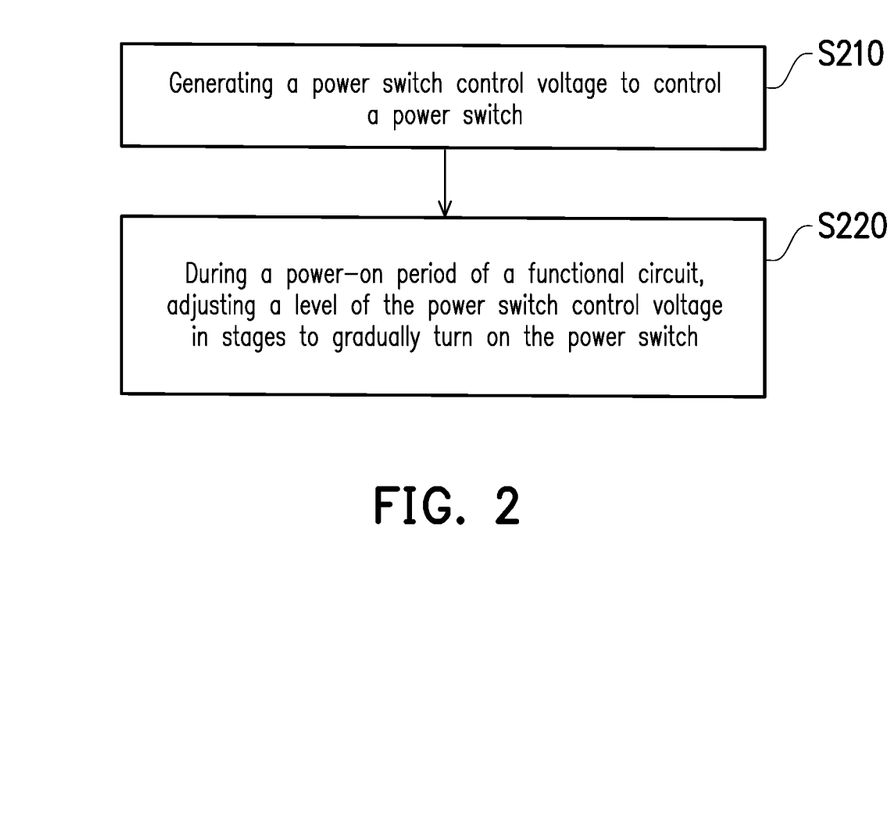
FIG. 2 is a schematic flowchart illustrating a control method for a power switch according to an embodiment of the disclosure.

FIG. 2 is a schematic flowchart illustrating a control method for a power switch SWbus according to an embodiment of the disclosure. With reference to FIG. 1 and FIG. 2, the PD controller IC 120 may generate the power switch control voltage SW_EN to control the power switch SWbus (step S210). The PD controller IC 120 is further coupled to a configuration channel (CC) pin of the USB connector 110. When a USB host (or a USB charger or a USB adapter, not shown in FIG. 1) is connected to the USB connector 110 of the consumer electronic product 100, the PD controller IC 120 may exchange configuration information with the USB host via the CC pin of the USB connector 110 to negotiate a power transmission mode between the USB host and the consumer electronic product 100. Operations in association with the CC pin are regulated in the USB specification and thus will not be described hereinafter. After the power transmission mode is determined, the PD controller IC 120 may turn on the power switch SWbus.

The PD controller IC 120 may adjust a level of the power switch control voltage SW_EN in stages during a power-on period of the functional circuit 130 to gradually turn on the power switch SWbus (step S220). For instance, the power-on period may be divided into n adjustment periods, where n is an integer greater than 1. The PD controller IC 120 may adjust the power switch control voltage SW_EN to an i-th level in an i-th adjustment period (any adjustment period of the n adjustment periods), where i is an integer greater than 0 and less than or equal to n, and the i-th level is between an (i−1)th level and an (i+1)th level. The (i−1)th level is a voltage level of the power switch control voltage SW_EN in an (i−1)th adjustment period, where the (i−1)th adjustment period is earlier than the i-th adjustment period. The (i+1)th level is a voltage level of the power switch control voltage SW_EN in an (i+1)th adjustment period, where the (i+1)th adjustment period is later than the i-th adjustment period. After the power switch control voltage SW_EN is adjusted to the i-th level, the PD controller IC 120 may keep the power switch control voltage SW_EN at the i-th level until the i-th adjustment period ends.

The USB specification regulates a slew rate (SR) of a power voltage supplying power to the functional circuit 130 when the power switch SWbus is turned on. The PD controller IC 120 may adjust the level of the power switch control voltage SW_EN in stages during the power-on period of the functional circuit 130 to gradually turn on the power switch SWbus. Therefore, the SR of the power voltage passing through the power switch SWbus may comply with the USB specification. After the power switch SWbus is turned on, the USB host may supply power to the functional circuit 130 of the consumer electronic product 100 through the USB connector 110 and the power switch SWbus.

Figure 3:
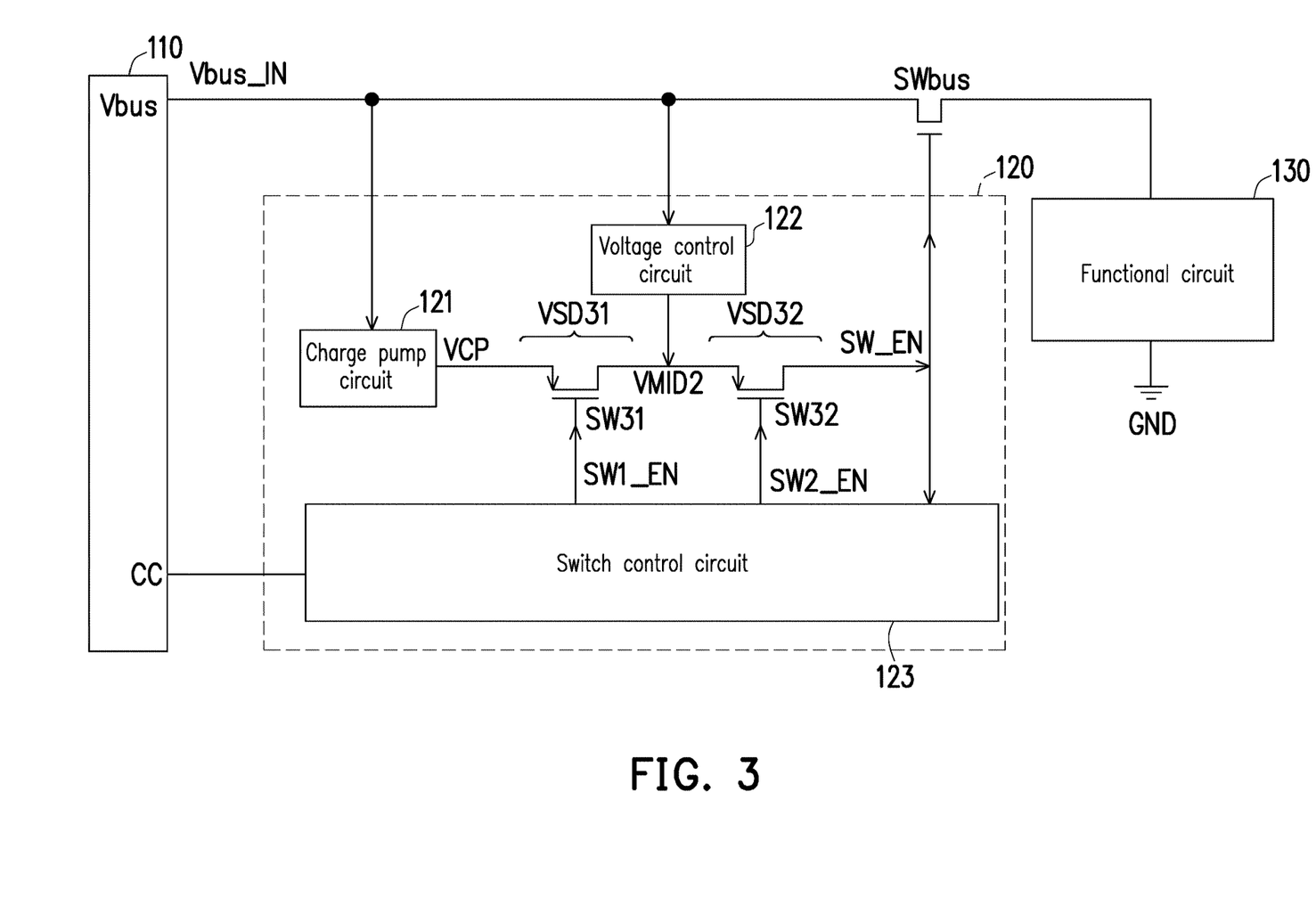
FIG. 3 is a schematic circuit block view illustrating a PD controller IC according to an embodiment of the disclosure.

FIG. 3 is a schematic circuit block view illustrating a PD controller IC 120 according to an embodiment of the disclosure. The PD controller IC 120 shown in FIG. 3 may serve as one of many exemplary embodiments of the PD controller IC 120 shown in FIG. 1. The PD controller IC 120 includes n switches, such as a switch SW31 and a switch SW32 shown in FIG. 3. The number n of the switches of the PD controller IC 120 may be determined according to the actual design. For instance, in other embodiments, the PD controller IC 120 may include three or more switches. The PD controller IC 120 shown in FIG. 3 further includes a charge pump circuit 121, a voltage control circuit 122, and a switch control circuit 123. According to different designs, in some embodiments, the PD controller IC 120 and (or) the switch control circuit 123 may be implemented in form of a hardware circuit. In another embodiment, the PD controller IC 120 and (or) the switch control circuit 123 may be implemented in form of firmware, software (i.e., a program), or a combination thereof. In another embodiment, the PD controller IC 120 and (or) the switch control circuit 123 may be implemented in form of a combination of hardware, firmware, and software.

The charge pump circuit 121 may receive an input voltage Vbus_IN from the power pin Vbus of the USB connector 110 and generate a charge pump voltage VCP. According to the actual design, the charge pump circuit 121 may include any charge pump circuit, such as a known charge pump or other charge pump circuits. Based on characteristics of driving the power switch SWbus, the charge pump circuit 121 may generate the charge pump voltage VCP adapted to the power switch SWbus. For instance, if it is assumed that the power switch SWbus may be effectively turned on (completely turned on) when the power switch control voltage SW_EN is greater than the input voltage Vbus_IN, the charge pump circuit 121 may generate the charge pump voltage VCP greater than the input voltage Vbus_IN to adapt to the characteristics of driving the power switch SWbus. A first terminal of the switch SW31 is coupled to an output terminal of the charge pump circuit 121 to receive the charge pump voltage VCP. A first terminal of the switch SW32 is coupled to a second terminal of the switch SW31. The voltage control circuit 122 is coupled to the first terminal of switch SW32 and the second terminal of the switch SW31. A second terminal of the switch SW32 is coupled to the control terminal of power switch SWbus to provide the power switch control voltage SW_EN. The switch control circuit 123 may generate control signals SW1_EN and SW2_EN to control the switch SW31 and the switch SW32.

The switch control circuit 123 is coupled to the CC pin of the USB connector 110. When a USB host (or a USB charger or a USB adapter, not shown in FIG. 3) is connected to USB connector 110, the switch control circuit 123 may exchange configuration information with the USB host via the CC pin of the USB connector 110 to negotiate a power transmission mode between the USB host and the consumer electronic product 100. After the power transmission mode is determined, the switch control circuit 123 may turn on the switches SW31 and SW32 sequentially at different time points to provide/control the high-level power switch control voltage SW_EN to the control terminal of the power switch SWbus and then gradually turn on the power switch SWbus.

Figure 4:
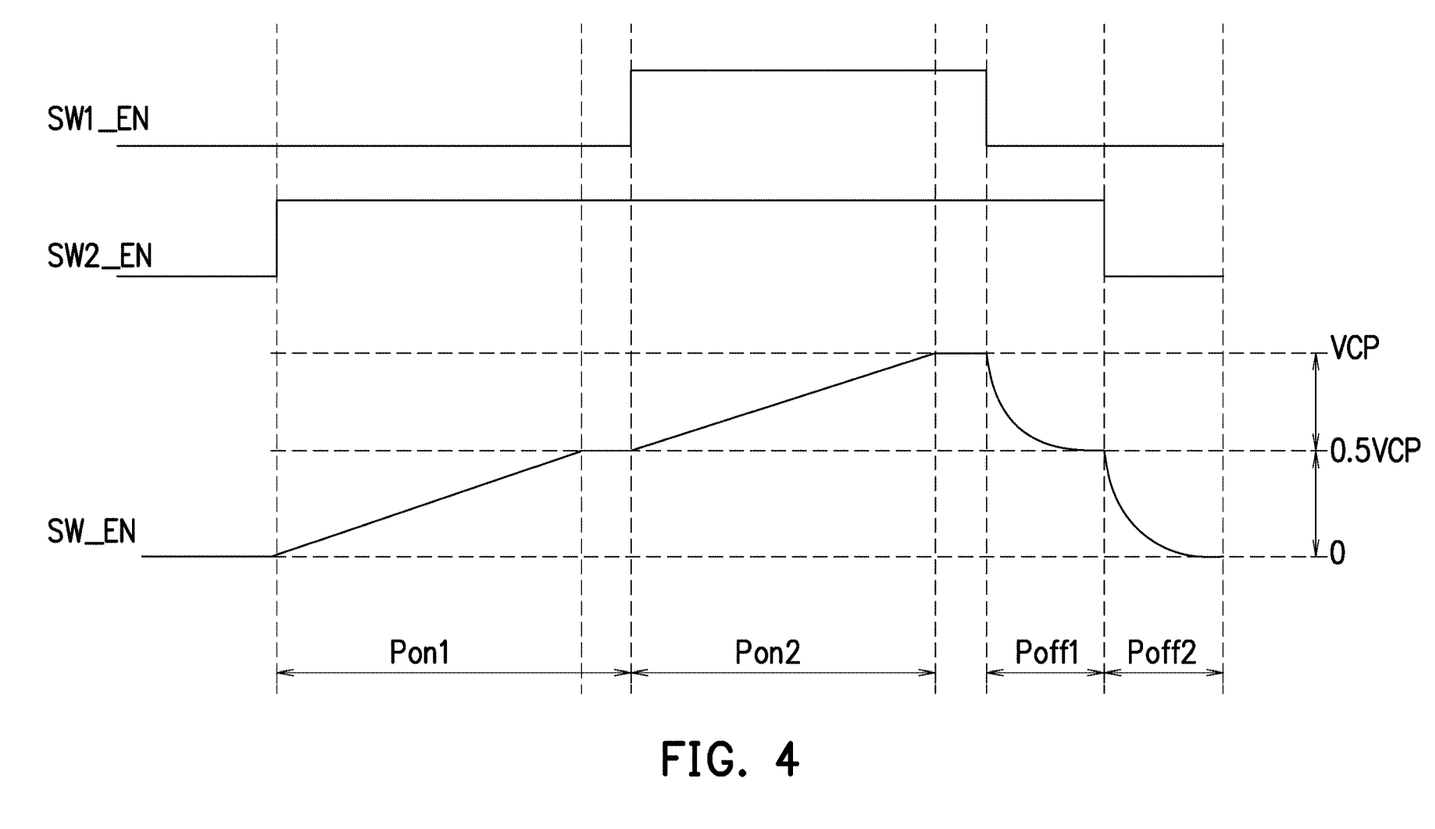
FIG. 4 is a schematic timing diagram illustrating control signals according to an embodiment of the disclosure.

FIG. 4 is a schematic timing diagram illustrating a control signal SW1_EN, a control signal SW2_EN, and a power switch control voltage SW_EN according to an embodiment of the disclosure. With reference to FIG. 3 and FIG. 4, the switch control circuit 123 may generate the control signals SW1_EN and SW2_EN to control the switch SW31 (a first switch) and the switch SW32 (a second switch). The switch SW31 and the switch SW32 are turned off before the power-on period; at this time, the voltage control circuit 122 may keep a voltage VMID2 shown in FIG. 3 (i.e., a voltage of the first terminal of the switch SW32 and a voltage of the second terminal of the switch SW31) at a central level of the swing range of the power switch control voltage SW_EN. In the embodiment shown in FIG. 4, the swing range of the power switch control voltage SW_EN is 0V-VCP, and the voltage control circuit 122 may keep the voltage VMID2 to be at the level of 0.5VCP. In view of the above, even though the charge pump voltage VCP is greater than the maximum withstanding voltage of either the switch SW31 or the switch SW32, a voltage difference between the two terminals of the switch SW31 (e.g., a source-drain voltage Vsd) may be less than the maximum withstanding voltage of the switch SW31, and a voltage difference between the two terminals of the switch SW32 (e.g., the source-drain voltage Vsd) may be less than the maximum withstanding voltage of the switch SW32.

The switch control circuit 123 turns on the switch SW31 and the switch SW32 in an order from the switch SW32 to the switch SW31 at different time points during the power-on period to control/provide the high-level power switch control voltage SW_EN to the control terminal of the power switch SWbus. For instance, in the embodiment shown in FIG. 4, the power-on period may be divided into adjustment periods Pon1 and Pon2. In the adjustment period Pon1, the switch SW31 is turned off and the switch SW32 is turned on; at this time, the switch SW32 may transmit the voltage VMID2 provided by the voltage control circuit 122 and acting as the power switch control voltage SW_EN to the control terminal of the power switch SWbus. At this time, the source-drain voltage Vsd of the switch SW31 that is turned off still does not exceed the maximum withstanding voltage of the switch SW31. In the adjustment period Pon2, the switch SW31 and the switch SW32 are turned on; at this time, the switches SW31 and SW32 may transmit the charge pump voltage VCP provided by the charge pump circuit 121 and acting as the power switch control voltage SW_EN to the control terminal of the power switch SWbus. Therefore, the PD controller IC 120 may adjust the level of the power switch control voltage SW_EN in stages during the power-on period of the functional circuit 130 to gradually turn on the power switch SWbus.

For instance, if it is assumed that the input voltage Vbus_IN is 24V, the charge pump voltage VCP is 29V (i.e., the swing range of the power switch control voltage SW_EN is 0V-29V), and the maximum withstanding voltage of the source-drain voltage Vsd is 18V when the switch SW31 and switch SW32 are turned off. When the switch SW31 and the switch SW32 are turned off, the voltage control circuit 122 may keep the voltage VMID2 shown in FIG. 3 (i.e., a voltage of the first terminal of the switch SW32 and a voltage of the second terminal of the switch SW31) to be at the central level (e.g., 15V) of the swing range of the power switch control voltage SW_EN. At this time, although the charge pump voltage VCP is greater than the maximum withstanding voltage of either the switch SW31 or the switch SW32, both the source-drain voltage Vsd (a voltage difference VSD31) of the switch SW31 and the source-drain voltage Vsd (a voltage difference VSD32) of the switch SW32 do not exceed 18V. When the switch SW31 is turned off and the switch SW32 is turned on, the voltage control circuit 122 may transmit the voltage VMID2 (15V) acting as the power switch control voltage SW_EN to the control terminal of the power switch SWbus through the switch SW32. At this time, the source-drain voltage Vsd of the switch SW31 that is turned off still does not exceed 18V. When the switch SW31 and the switch SW32 are turned on, the charge pump circuit 121 may transmit the charge pump voltage VCP (29V) acting as the power switch control voltage SW_EN to the control terminal of the power switch SWbus through the switch SW31 and the switch SW32. Therefore, the PD controller IC 120 may adjust the level of the power switch control voltage SW_EN in stages during the power-on period of the functional circuit 130 to gradually turn on the power switch SWbus.

The switch control circuit 123 turns off the switches SW31 and SW32 at different time points during a power-off period of the functional circuit in an order from the switch SW31 to the switch SW32. In the embodiment shown in FIG. 4, the power-off period may be divided into the adjustment periods Poff1 and Poff2. In the adjustment period Poff1, the switch SW31 is turned off and the switch SW32 is turned on; at this time, the voltage VMID2 provided by the voltage control circuit 122 may ensure that the source-drain voltage Vsd of the switch SW31 that is turned off does not exceed the maximum withstanding voltage of the switch SW31. In the adjustment period Poff2, the switch SW31 and the switch SW32 are turned off; at this time, the power switch control voltage SW_EN is dropped to the lowest level (e.g., 0V) to turn off the power switch SWbus. Therefore, the PD controller IC 120 may adjust the level of the power switch control voltage SW_EN in stages during the power-off period of the functional circuit 130.

To sum up, the charge pump voltage VCP generated by the PD controller IC 100 may serve as the power switch control voltage SW_EN and may be transmitted to the control terminal of the power switch SWbus through a plurality of switches, such as the switches SW31 and SW32. The switches SW31 and SW32 are turned on or turned off, based on which the power switch control voltage SW_EN may control the power switch SWbus coupled between the USB connector 110 and the functional circuit 130. When the switch SW31 is turned off, the voltage control circuit 122 may ensure the voltage difference VSD31 (e.g., the source-drain voltage Vsd) between the two terminals of the switch SW31 to be less than the maximum withstanding voltage of the switch SW31. The voltage withstanding range of each of the switch SW31 and the switch SW32 may be less than the swing range of the power switch control voltage SW_EN. Hence, the PD controller IC 120 configured to provide/control the high control voltage may be implemented by performing a normal low-voltage manufacturing process rather than performing a relatively expensive high-voltage manufacturing process.

Although FIG. 3 shows two switches SW31 and SW32, more switches may be deduced therefrom by people with ordinary knowledge in the pertinent field based on the relevant descriptions in association with FIG. 3. An embodiment of n switches implemented in a general manner is provided hereinafter. A first terminal of a first switch of the n switches is coupled to an output terminal of the charge pump circuit 121 to receive the charge pump voltage VCP. A first terminal of a j-th switch of the n switches is coupled to a second terminal of an (j−1)th switch of the n switches, where j is an integer greater than 1 and less than or equal to n. A second terminal of an n-th switch of the n switches is coupled to the control terminal of the power switch SWbus to provide the power switch control voltage SW_EN. The voltage control circuit 122 is coupled to the first terminal of the j-th switch and the second terminal of the (j−1)th switch. When the (j−1)th switch is turned off, the voltage control circuit 122 may keep the voltage of the first terminal of the j-th switch and the voltage of the second terminal of the (j−1)th switch to be at the j-th level, where the j-th level is between the voltage level of the first terminal of the (j−1)th switch that is turned off and the voltage level of the second terminal of the j-th switch that is turned off. The switch control circuit 123 is coupled to a control terminal of each of the n switches. The switch control circuit 123 turns on the n switches at different time points during the power-on period in an order from the n-th switch to the first switch. The switch control circuit 123 turns off the n switches at different time points during the power-off period of the functional circuit in an order from the first switch to the n-th switch.

Figure 5:
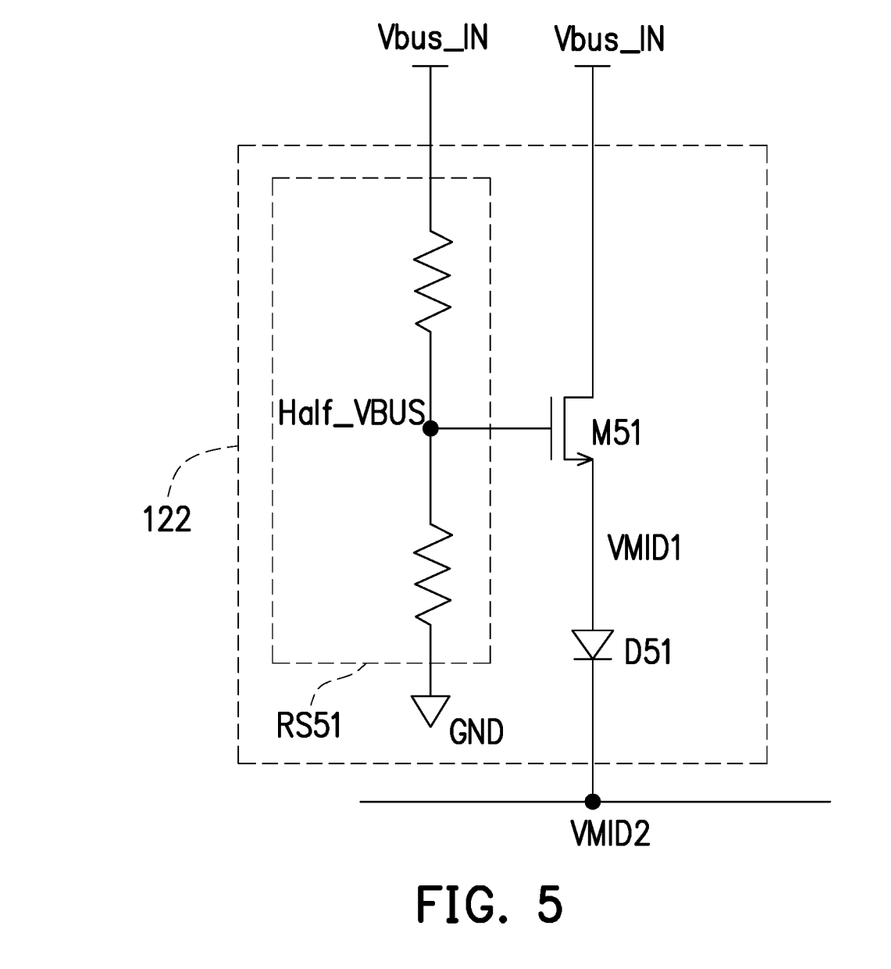
FIG. 5 is a schematic circuit view illustrating a voltage control circuit according to an embodiment of the disclosure.

FIG. 5 is a schematic circuit view illustrating a voltage control circuit 122 according to an embodiment of the disclosure. The voltage control circuit 122 shown in FIG. 5 may serve as one of many exemplary embodiments of the voltage control circuit 122 shown in FIG. 3. In the embodiment shown in FIG. 5, the voltage control circuit 122 includes a voltage dividing resistor string RS51, a transistor M51, and a diode D51. A first terminal of the voltage dividing resistor string RS51 is coupled to the power pin Vbus of the USB connector 110 to receive the input voltage Vbus_IN. A second terminal of the voltage dividing resistor string RS51 is coupled to a reference voltage (e.g., a ground voltage GND or other fixed voltages). A control terminal (e.g., a gate) of the transistor M51 is coupled to a voltage dividing node of the voltage dividing resistor string RS51 to receive a divided voltage Half VBUS. A first terminal (e.g., a drain) of the transistor M51 is coupled to the power pin Vbus of the USB connector 110 to receive the input voltage Vbus_IN. A first terminal of the diode D51 (e.g., an anode) is coupled to a second terminal of the transistor M51 (e.g., a source) to receive a voltage VMID1. A second terminal (e.g., a cathode) of the diode D51 is coupled to the first terminal of the j-th switch (e.g., the switch SW32) and the second terminal of the (j−1)th switch (e.g., the switch SW31) to provide the voltage VMID2.

Figure 6:
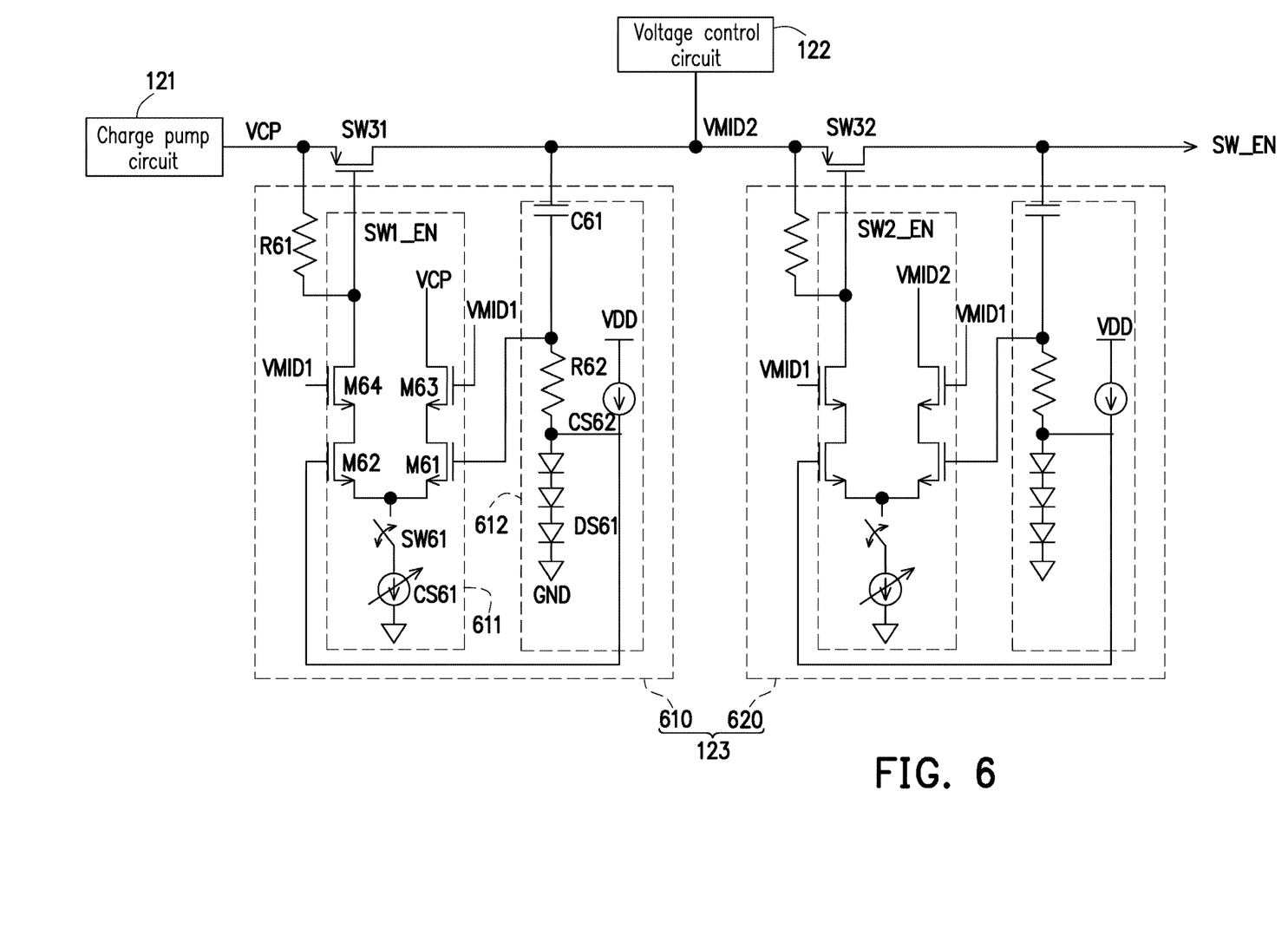
FIG. 6 is a schematic circuit view illustrating a switch control circuit according to an embodiment of the disclosure.

The switch control circuit 123 shown in FIG. 3 may include n conversion control circuits. The conversion control circuits are coupled to the control terminals of the n switches (e.g., the switches SW31 and SW32) in a one-to-one manner. Here, an i-th conversion control circuit of the conversion control circuits turns on the i-th switch of the n switches at a corresponding time point in the power-on period. For instance, FIG. 6 is a schematic circuit view illustrating a switch control circuit 123 according to an embodiment of the disclosure. The switch control circuit 123 shown in FIG. 6 may serve as one of many exemplary embodiments of the switch control circuit 123 shown in FIG. 3.

In the embodiment shown in FIG. 6, the switch control circuit 123 includes conversion control circuits 610 and 620. The conversion control circuits 610 and 620 are coupled to control terminals of the switches SW31 and SW32 in a one-to-one manner. The conversion control circuit 610 (the first conversion control circuit) turns on the switch SW31 (the first switch) in the adjustment period Pon2 during the power-on period. The conversion control circuit 620 (the second conversion control circuit) turns on the switch SW32 (the second switch) in the adjustment period Pon1 during the power-on period. The conversion control circuit 610 and the conversion control circuit 620 may have the same circuit structure. The conversion control circuit 610 is taken as an example for explanation below. The conversion control circuit 620 may be deduced by referring to the relevant descriptions of the conversion control circuit 610 and thus will not be further explained hereinafter.

In the embodiment shown in FIG. 6, the conversion control circuit 610 includes a resistor R61, a differential amplifier circuit 611, and a feedback circuit 612. A first terminal and a second terminal of the resistor R61 are respectively coupled to the first terminal and the control terminal of the i-th switch (e.g., the source and the gate of the switch SW31). The differential amplifier circuit 611 is coupled to the control terminal of the i-th switch. A feedback terminal of the feedback circuit 612 is coupled to the second terminal of the i-th switch (e.g., the drain of switch SW31). A first output terminal and a second output terminal of the feedback circuit 612 are respectively coupled to a first differential input terminal and a second differential input terminal of the differential amplifier circuit 611.

In the embodiment shown in FIG. 6, the differential amplifier circuit 611 includes a current source CS61, a current source switch SW61, a transistor M61, a transistor M62, a transistor M63, and a transistor M64. A first terminal of the current source switch SW61 is coupled to the current source CS61. A first terminal (such as a source) of the transistor M61 and a first terminal (such as a source) of the transistor M62 are coupled to a second terminal of the current source switch SW61. A control terminal (such as a gate) of the transistor M61 is coupled to a first output end of the feedback circuit 612. A control terminal (such as a gate) of the transistor M62 is coupled to a second output terminal of the feedback circuit 612. A first terminal (such as a source) of the transistor M63 is coupled to a second terminal (such as a drain) of the transistor M61. A second terminal (such as a drain) of the transistor M63 is coupled to the first terminal of the i-th switch (such as the source of the switch SW31) to receive the charge pump voltage VCP. A first terminal (such as a source) of the transistor M64 is coupled to a second terminal (such as a drain) of the transistor M62. A second terminal (such as a drain) of the transistor M64 is coupled to the control terminal of the i-th switch (such as the gate of the switch SW31). A control terminal (such as a gate) of the transistor M63 and a control terminal (such as a gate) of the transistor M64 are coupled to a reference voltage (such as the voltage VMID1 shown in FIG. 5).

When the current source switch SW61 is turned off, the resistor R61 pulls up a gate voltage of the switch SW31 to a source voltage of the switch SW31, and thus the switch SW31 is turned off. When the current source switch SW61 is turned on, the differential amplifier circuit 611 pulls down the gate voltage of the switch SW31, and thus the switch SW31 is turned on. By adjusting the current of the current source CS61, the SR of the control signal SW1_EN may be set.

In the embodiment shown in FIG. 6, the feedback circuit 612 includes a capacitor C61, a resistor R62, a diode string DS61, and a current source CS62. A first terminal of the capacitor C61 is coupled to the second terminal of the i-th switch (such as the drain of the switch SW31). A second terminal of the capacitor C61 is coupled to the first differential input terminal of the differential amplifier circuit 611. A first terminal of the resistor R62 is coupled to the second terminal of the capacitor C61. A second terminal of the resistor R62 is coupled to the second differential input terminal of the differential amplifier circuit 611. A first terminal (such as an anode) of the diode string DS61 is coupled to the second terminal of resistor R62. A second terminal (such as a cathode) of the diode string DS61 is coupled to a reference voltage (such as the ground voltage GND or other fixed voltages). The current source CS62 is coupled to the second terminal of the resistor R62. The reference symbol "VDD" shown in FIG. 6 represents a voltage source.

To sum up, the PD controller IC 120 provided in one or more of the above embodiments is able to adjust the level of the power switch control voltage SW_EN in stages during the power-on period of the functional circuit 130 to gradually turn on the power switch SWbus. Therefore, the SR of the power voltage passing through the power switch SWbus may meet the USB specification. In some embodiments, the charge pump voltage VCP generated by PD controller IC 120 may serve as the power switch control voltage SW_EN and may be transmitted to the control terminal of the power switch SWbus through a plurality of switches of the PD controller IC 120 (such as the switches SW31 and SW32 shown in FIG. 3). The switches SW31 and SW32 are turned on or turned off, based on which the power switch control voltage SW_EN may serve to control the power switch SWbus coupled between the USB connector 110 and the functional circuit 130. When the switch SW31 is turned off, the voltage control circuit 122 may ensure the voltage difference VSD31 (such as the source-drain voltage Vsd) between the voltage of the first terminal of the switch SW31 and the voltage of the second terminal of the switch SW31 to be less than the maximum withstanding voltage of the switch SW31. As a result, the PD controller IC 120 configured to provide the high-level control voltage (the power switch control voltage SW_EN) may be implemented by performing a normal low-voltage manufacturing process instead of a relatively expensive high-voltage manufacturing process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power delivery controller integrated circuit, configured to generate a power switch control voltage to control a power switch, wherein a first terminal and a second terminal of the power switch are respectively coupled to a power pin of a universal serial bus connector and a power input terminal of a functional circuit, the power delivery controller integrated circuit adjusts a plurality of levels of the power switch control voltage in stages corresponding to a plurality of adjustment periods divided from a power-on period of the functional circuit to gradually turn on the power switch, to make a slew rate of a power voltage passing through the power switch meet a USB specification.

2. The power delivery controller integrated circuit according to claim 1, wherein the power-on period is divided into n adjustment periods, n is an integer greater than 1, the power delivery controller integrated circuit adjusts the power switch control voltage to an i-th level in an i-th adjustment period of the n adjustment periods, i is an integer greater than 0 and less than or equal to n, the i-th level is between an (i−1)th level of the power switch control voltage and an (i+1)th level of the power switch control voltage, and after the power switch control voltage is adjusted to the i-th level, the power delivery controller integrated circuit keeps the power switch control voltage to be at the i-th level until the i-th adjustment period ends.

3. The power delivery controller integrated circuit according to claim 1, comprising:

a charge pump circuit, configured to receive an input voltage from the power pin of the universal serial bus connector and generate a charge pump voltage;

n switches, wherein n is an integer greater than 1, a first terminal of a first switch of the n switches is coupled to an output terminal of the charge pump circuit to receive the charge pump voltage, a first terminal of a j-th switch of the n switches is coupled to a second terminal of a (j−1)th switch of the n switches, j is an integer greater than 1 and less than or equal to n, and a second terminal of an n-th switch of the n switches is coupled to a control terminal of the power switch to provide the power switch control voltage; and a voltage control circuit, coupled to the first terminal of the j-th switch and the second terminal of the (j−1)th switch, wherein when the (j−1)th switch is turned off, the voltage control circuit keeps a voltage of the first terminal of the j-th switch and a voltage of the second terminal of the (j−1)th switch to be at a j-th level, and the j-th level is between the voltage level of the first terminal of the (j−1)th switch which is turned off and the voltage level of the second terminal of the j-th switch which is turned off.

4. The power delivery controller integrated circuit according to claim 3, wherein a voltage withstanding range of each of the switches is less than a swing range of the power switch control voltage.

5. The power delivery controller integrated circuit according to claim 3, wherein n is 2, the voltage control circuit is coupled to a first terminal of a second switch of the switches and a second terminal of the first switch, a second terminal of the second switch is coupled to the control terminal of the power switch to provide the power switch control voltage, and when the first switch is turned off, the voltage control circuit keeps a voltage of the first terminal of the second switch and a voltage of the second terminal of the first switch to be at a central level of a swing range of the power switch control voltage.

6. The power delivery controller integrated circuit according to claim 3, wherein the voltage control circuit comprises:
a voltage dividing resistor string, having a first terminal and a second terminal respectively coupled to the power pin of the universal serial bus connector and a reference voltage;
a transistor, having a control terminal coupled to a voltage dividing node in the voltage dividing resistor string, wherein a first terminal of the transistor is coupled to the power pin of the universal serial bus connector; and
a diode, having a first terminal coupled to a second terminal of the transistor, wherein a second terminal of the diode is coupled to the first terminal of the j-th switch and the second terminal of the (j−1)th switch.

7. The power delivery controller integrated circuit according to claim 3, further comprising:
a switch control circuit, coupled to a control terminal of each of the n switches, wherein the switch control circuit turns on the n switches at different time points in the power-on period in an order from the n-th switch to the first switch.

8. The power delivery controller integrated circuit according to claim 7, wherein the switch control circuit turns off the n switches at different time points during a power-off period of the functional circuit in an order from the first switch to the n-th switch.

9. The power delivery controller integrated circuit according to claim 7, wherein the switch control circuit comprises:
n conversion control circuits, coupled to control terminals of the n switches, wherein an i-th conversion control circuit of the n conversion control circuits turns on an i-th switch of the n switches at a corresponding time point in the power-on period.

10. The power delivery controller integrated circuit according to claim 9, wherein the i-th conversion control circuit comprises:
a first resistor, having a first terminal and a second terminal respectively coupled to a first terminal and a control terminal of the i-th switch;

a differential amplifier circuit, coupled to the control terminal of the i-th switch; and
a feedback circuit, having a feedback terminal coupled to a second terminal of the i-th switch, wherein a first output terminal and a second output terminal of the feedback circuit are respectively coupled to a first differential input terminal and a second differential input terminal of the differential amplifier circuit.

11. The power delivery controller integrated circuit according to claim 10, wherein the differential amplifier circuit comprises:
a current source;
a current source switch, having a first terminal coupled to the current source;
a first transistor, having a first terminal coupled to a second terminal of the current source switch, wherein a control terminal of the first transistor is coupled to the first output terminal of the feedback circuit;
a second transistor, having a first terminal coupled to the second terminal of the current source switch, wherein a control terminal of the second transistor is coupled to the second output terminal of the feedback circuit;
a third transistor, having a first terminal coupled to a second terminal of the first transistor, wherein a second terminal of the third transistor is coupled to the first terminal of the i-th switch, and a control terminal of the third transistor is coupled to a reference voltage; and
a fourth transistor, having a first terminal coupled to a second terminal of the second transistor, wherein a second terminal of the fourth transistor is coupled to the control terminal of the i-th switch, and a control terminal of the fourth transistor is coupled to the reference voltage.

12. The power delivery controller integrated circuit according to claim 10, wherein the feedback circuit comprises:
a capacitor, having a first terminal coupled to the second terminal of the i-th switch, wherein a second terminal of the capacitor is coupled to the first differential input terminal of the differential amplifier circuit;
a second resistor, having a first terminal coupled to the second terminal of the capacitor, wherein a second terminal of the second resistor is coupled to the second differential input terminal of the differential amplifier circuit;
a diode string, having a first terminal coupled to the second terminal of the second resistor, wherein a second terminal of the diode string is coupled to a reference voltage; and
a current source, coupled to the second terminal of the second resistor.

13. A control method for a power switch, the control method comprising:
generating a power switch control voltage by a power delivery controller integrated circuit to control the power switch, wherein a first terminal and a second terminal of the power switch are respectively coupled to a power pin of a universal serial bus connector and a power input terminal of a functional circuit; and
adjusting a plurality of levels of the power switch control voltage in stages corresponding to a plurality of adjustment periods divided from a power-on period of the functional circuit to gradually turn on the power switch, to make a slew rate of a power voltage passing through the power switch meet a USB specification.

14. The control method according to claim 13, wherein the power-on period is divided into n adjustment periods, n is an integer greater than 1, and the control method further comprises:
adjusting the power switch control voltage to an i-th level in an i-th adjustment period of the n adjustment periods, wherein i is an integer greater than 0 and less than or equal to n, and the i-th level is between an (i−1)th level of the power switch control voltage and an (i+1)th level of the power switch control voltage; and
after the power switch control voltage is adjusted to the i-th level, keeping the power switch control voltage to be at the i-th level until the i-th adjustment period ends.

15. The control method according to claim 13, further comprising
receiving an input voltage from the power pin of the universal serial bus connector by a charge pump circuit of the power delivery controller integrated circuit, and generating and providing a charge pump voltage to a first terminal of a first switch of the n switches of the power delivery controller integrated circuit, wherein n is an integer greater than 1, a first terminal of a j-th switch of the n switches is coupled to a second terminal of a (j−1)th switch of the n switches, j is an integer greater than 1 and less than or equal to n, and a second terminal of an n-th switch of the n switches is coupled to a control terminal of the power switch to provide the power switch control voltage; and
when the (j−1)th switch is turned off, keeping a voltage of the first terminal of the j-th switch and a voltage of the second terminal of the (j−1)th switch to be at a j-th level by a voltage control circuit of the power delivery controller integrated circuit, wherein the j-th level is between the voltage level of the first terminal of the (j−1)th switch which is turned off and the voltage level of the second terminal of the j-th switch which is turned off.

16. The control method according to claim 15, wherein a voltage withstanding range of each of the switches is less than a swing range of the power switch control voltage.

17. The control method according to claim 15, wherein n is 2, the voltage control circuit is coupled to a first terminal of a second switch of the switches and a second terminal of the first switch, a second terminal of the second switch is coupled to the control terminal of the power switch to provide the power switch control voltage, and when the first switch is turned off, the voltage control circuit keeps a voltage of the first terminal of the second switch and a voltage of the second terminal of the first switch to be at a central level of a swing range of the power switch control voltage.

18. The control method according to claim 15, further comprising:
turning on the n switches at different time points in the power-on period in an order from the n-th switch to the first switch.

19. The control method according to claim 15, further comprising:
turning off the n switches at different time points during a power-off period of the functional circuit in an order from the first switch to the n-th switch.

* * * * *